(12) United States Patent
Wu et al.

(10) Patent No.: US 8,349,461 B2
(45) Date of Patent: Jan. 8, 2013

(54) PHOTO-CURING POLYSILOXANE COMPOSITION AND PROTECTIVE FILM FORMED FROM THE SAME

(75) Inventors: Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 5 days.

(21) Appl. No.: 13/213,346

(22) Filed: Aug. 19, 2011

(65) Prior Publication Data

US 2012/0052439 A1 Mar. 1, 2012

(30) Foreign Application Priority Data

Aug. 31, 2010 (TW) .............................. 99129248 A

(51) Int. Cl.
*C08F 2/50* (2006.01)
(52) U.S. Cl. ................ 428/447; 522/6; 522/27; 522/48; 522/49; 522/59; 522/99
(58) Field of Classification Search ......................... None
See application file for complete search history.

(56) References Cited

OTHER PUBLICATIONS

Abstract for JP 2009-237531 (Oct. 2009).*
Abstract for JP 2009-186677 (Aug. 2009).*
Abstract for JP 2008-116904 (May 2008).*
Machine translation of JP 2009-237531 into English (no date).*

* cited by examiner

*Primary Examiner* — Marc Zimmer
(74) *Attorney, Agent, or Firm* — Fox Rothschild, LLP; Robert J. Sacco

(57) ABSTRACT

A photo-curing polysiloxane composition includes a polysiloxane, an o-naphthoquinonediazidesulfonate compound, and a solvent. The polysiloxane contains less than 30 wt % of a polysiloxane fraction having a molecular weight above 8,000, and 35 wt % to 60 wt % of a polysiloxane fraction having a molecular weight ranging from 500 to 2,000 when calculated from an integral molecular weight distribution curve obtained by plotting cumulative weight percentage versus molecular weight falling within a range between 500 and 50,000 measured by gel permeation chromatography. A protective film formed from the photo-curing polysiloxane composition and an element containing the protective film are also disclosed.

6 Claims, 2 Drawing Sheets

PHOTO-CURING POLYSILOXANE COMPOSITION AND PROTECTIVE FILM FORMED FROM THE SAME

CROSS-REFERENCE TO RELATED APPLICATION

This application claims priority of Taiwanese Application No. 099129248, filed on Aug. 31, 2010.

BACKGROUND OF THE INVENTION

1. Field of the Invention

This invention relates to a photo-curing polysiloxane composition, more particularly to a photo-curing polysiloxane composition for forming a planarizing film for a substrate of a liquid crystal display (LCD), an organic electroluminescene display, and the like, an interlayer insulating film, and a core or a cladding of an optical waveguide as a protective film. This invention also relates to a protective film formed from the photo-curing polysiloxane composition and an element containing the protective film.

2. Description of the Related Art

Recently, in order to obtain high resolution and high definition of an image quality for a display, such as a liquid crystal display, an organic electroluminescene display, or the like, a method for improving an aperture ratio of a display is used in the art. JP 9-152625 discloses a method for improving the aperture ratio by providing a transparent and planarizing protective film on a TFT substrate so as to overlap a data line and a pixel electrode.

The protective film is generally formed from a material having good heat resistance and high transparency. JP 10-153854 and JP 2001-281853 disclose a photosensitive resin composition, which includes alkali-soluble acrylic resin, a compound containing a quinonediazido group, a crosslinker or a photo-acid generator. However, these photosensitive resin compositions are insufficient in heat resistance, and the protective film formed from the photosensitive resin composition may have problems, such as discoloration and transparency reduction if treated at a high temperature.

On the other hand, JP 2004-10696 discloses a resin composition which is resistant to oxidative decomposition. The resin composition includes a resin having an imide structure, a siloxane polymer, a photo-acid generator, and a crosslinker. Although a protective film having high transparency can be formed from the resin composition, the protective film is insufficient in developing property and film thickness uniformity during development process.

It is still required in the art to provide a photosensitive resin composition which can be used to form a protective film having superior properties, such as transparency, developing property, and film thickness uniformity.

SUMMARY OF THE INVENTION

Therefore, an object of the present invention is to provide a photo-curing polysiloxane composition which can be used to form a protective film that is superior in developing property and film thickness uniformity.

According to a first aspect of this invention, there is provided a photo-curing polysiloxane composition including a polysiloxane, an o-naphthoquinonediazidesulfonate compound, and a solvent. The polysiloxane contains less than 30 wt % of a polysiloxane fraction having a molecular weight above 8,000, and 35 wt % to 60 wt % of a polysiloxane fraction having a molecular weight ranging from 500 to 2,000 when calculated from an integral molecular weight distribution curve obtained by plotting cumulative weight percentage versus molecular weight falling within a range between 500 and 50,000 measured by gel permeation chromatography.

According to a second aspect of this invention, there is provided a protective film which is adapted to be formed on a substrate. The protective film is formed by applying the photo-curing polysiloxane composition of this invention on the substrate.

According to a third aspect of this invention, there is provided an element including a substrate, and the protective film of this invention applied on the substrate.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENTS

Figure 1:
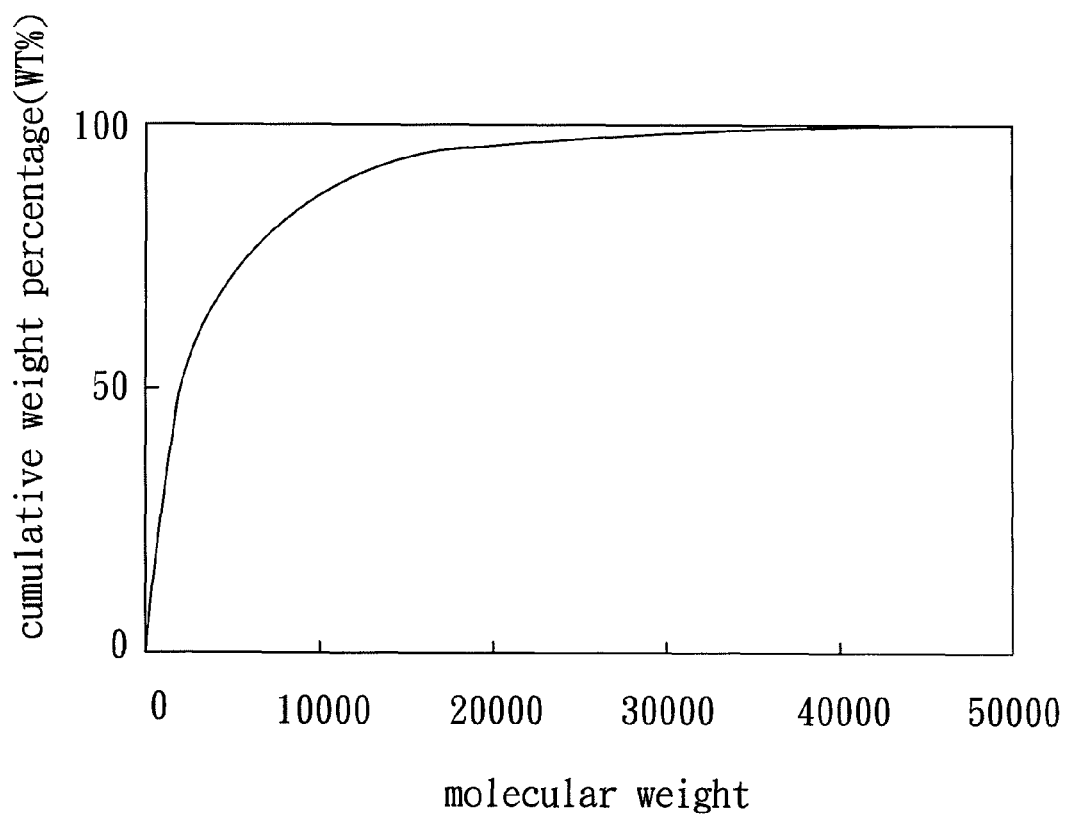
FIG. 1 is an example of an integral molecular weight distribution curve obtained by plotting cumulative weight percentage versus molecular weight.

The photo-curing polysiloxane composition of the present invention includes a polysiloxane, an o-naphthoquinonediazidesulfonate compound, and a solvent. The polysiloxane contains less than 30 wt % of a polysiloxane fraction having a molecular weight above 8,000, and 35 wt % to 60 wt % of a polysiloxane fraction having a molecular weight ranging from 500 to 2,000 when calculated from an integral molecular weight distribution curve obtained by plotting cumulative weight percentage versus molecular weight falling within a range between 500 and 50,000 measured by gel permeation chromatography.

Polysiloxane:

There is no specific limitation to the structure of polysiloxane. Preferably, the polysiloxane is obtained by subjecting a silane monomer, a siloxane prepolymer, or a combination of a silane monomer and a siloxane prepolyer to hydrolysis and partial condensation.

The silane monomer is preferably represented by Formula (I):

$$SiR^1{}_m(OR^2)_{4-m} \quad (I)$$

m denotes an integer ranging from 0 to 3.

$R^1$ represents a hydrogen atom, a substituted or unsubstituted $C_1$-$C_{10}$ alkyl group, a substituted or unsubstituted $C_2$-$C_{10}$ alkenyl group, or a substituted or unsubstituted $C_6$-$C_{15}$ aryl group. The plural $R^1$s can be identical with or different from each other when m is 2 or 3. Examples of the alkyl group include, but are not limited to, methyl, ethyl, n-propyl, isopropyl, n-butyl, tert-butyl, n-pentyl, n-decyl, trifluoromethyl, 3,3,3-trifluoropropyl, 3-glycidoxypropyl, 2-(3,4-epoxycyclohexyl)ethyl, 3-aminopropyl, 3-mercaptopropyl, 3-isocyanatopropyl, or the like. Examples of the alkenyl group include, but are not limited to, vinyl, 3-acryloxypropyl, 3-methacryloxypropyl, or the like. Examples of the aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, naphthyl, or the like.

$R^2$ represents a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. The plural $R^2$s can be identical with or different from each other when 4-m is 2, 3, or 4. Examples of the alkyl group include, but are not limited to, methyl, ethyl, n-propyl, isopropyl, n-butyl, or the like. Examples of the acyl group include, but are not limited to, acetyl, or the like. Examples of the aryl group include, but are not limited to, phenyl, or the like.

When m denotes 0, the silane monomer represents a tetrafunctional silane. When m denotes 1, the silane monomer represents a trifunctional silane. When m denotes 2, the silane monomer represents a difunctional silane. When m denotes 3, the silane monomer represents a monofunctional silane.

Examples of the silane monomer include, but are not limited to, (1)tetrafunctional silane: tetramethoxysilane, tetraethoxysilane, tetraacetoxysilane, tetraphenoxy silane, or the like; (2)trifunctional silane: methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloxypropyltrimethoxysilane, 3-acryloxypropyltriethoxysilane, 3-methylacryloxypropyltrimethoxysilane, 3-methylacryloxypropyltriethoxysilane, phenyltrimethoxysilane (PTMS), phenyltriethoxysilane (PTES), p-hydroxyphenyltrimethoxysilane, 1-(p-hydroxyphenyl) ethyltrimethoxysilane, 2-(p-hydroxyphenyl)ethyltrimethoxysilane, 4-hydroxy-5-(p-hydroxyphenylcarbonyloxy) pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl) ethyltrimethoxysilane, 3-mercaptopropyltrimethoxysilane, or the like; (3) difunctional silane: dimethyldimethoxysilane (DMDMS), dimethyldiethoxysilane, dimethyldiacetyloxysilane, di-n-butyldimethoxysilane, diphenyldimethoxysilane, or the like; and (4)monofunctional silane: trimethylmethoxysilane, tri-n-butylethoxysilane, 3-glycidoxydimethylmethoxysilane, 3-glycidoxydimethylethoxysilane, or the like. The aforesaid silane monomer can be used alone or as a mixture of two or more.

The siloxane prepolymer is preferably represented by Formula (II):

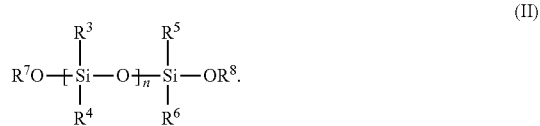

(II)

n denotes an integer ranging from 1 to 1,000, preferably from 3 to 300, and more preferably from 5 to 200.

$R^3$, $R^4$, $R^5$ and $R^6$ represent, respectively and independently, a hydrogen atom, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group. The plural $R^3$s and $R^4$s can be respectively identical with or different from each other when n is from 2 to 1,000. Examples of the alkyl group include, but are not limited to, methyl, ethyl, n-propyl, or the like. Examples of the alkenyl group include, but are not limited to, vinyl, acryloxypropyl, methacryloxypropyl, or the like. Examples of the aryl group include, but are not limited to, phenyl, tolyl, naphthyl, or the like.

$R^7$ and $R^8$ represent, respectively and independently, a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, n-butyl, or the like. Examples of the acyl group include, but are not limited to, acetyl, or the like. Examples of the aryl group include, but are not limited to, phenyl, or the like.

Examples of the siloxane prepolymer include, but are not limited to, 1,1,3,3-tetramethyl-1,3-dimethoxydisiloxane, 1,1,3,3-tetramethyl-1,3-diethoxydisiloxane, 1,1,3,3-tetraethyl-1,3-diethoxydisiloxane, and commercially available silanol terminal polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), or the like), or the like. The aforesaid siloxane prepolymer can be used alone or as a mixture of two or more.

When the silane monomer and the siloxane prepolymer are used in combination, there is no specific limitation to the mixing ratio thereof. Preferably, the molar ratio of the silane monomer and the siloxane prepolymer in Si atom ranges from 100:0 to 50:50.

Alternatively, polysiloxane can be prepared via copolymerization by mixing the silane monomer and/or siloxane prepolymer with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include commercially available products manufactured by Catalysts and Chemicals Ltd., for example, OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol), or the like; commercially available products manufactured by Fuso Chemical Co., Ltd., for example, Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone), or the like; and commercially available products manufactured Nissan Chemical, for example, IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol), or the like. The aforesaid silicon dioxide particles can be used alone or as a mixture of two or more.

There is no specific limitation to the amounts when mixing the silicon dioxide particles with the silane monomer and/or the siloxane prepolymer. Preferably, the molar ratio of the silicon dioxide particles to the polysiloxane in Si atom ranges from 1% to 50%.

The hydrolysis and the partial condensation can be conducted in a manner well known in the art. For example, a solvent, water, and optionally a catalyst are added to the mixture of the silane monomer and/or the siloxane prepolymer and/or the silicon dioxide particles, followed by stirring at a temperature ranging from 50 to 150° C. for 0.5 to 120 hours. During stirring, the by-products, such as alcohols and water, can be removed by distillation if necessary.

There is no specific limitation to the solvent, which can be identical with or different from the solvent contained in the photo-curing polysiloxane composition. Preferably, the solvent is used in an amount ranging generally from 15 g to 1200 g, preferably from 20 g to 1100 g, and more preferably from 30 g to 1000 g, based on 100 g of the silane monomer and/or the siloxane prepolymer.

The amount of water for the hydrolysis ranges from 0.5 to 2 moles based on 1 mole of the hydrolyzable groups contained in the mixture.

There is no specific limitation to the catalyst, and an acid catalyst or a base catalyst can be preferably used. Examples of the acid catalyst include hydrochloric acid, nitric acid, sulfuric acid, hydrofluoric acid, oxalic acid, phosphoric acid, acetic acid, trifluoroacetic acid, formic acid, polycarboxylic acids and anhydrides thereof, ion exchange resins, or the like. Examples of the base catalyst include diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilanes containing an amino group, ion exchange resins, or the like.

Preferably, the catalyst is used in an amount ranging generally from 0.005 g to 15 g, preferably from 0.01 g to 12 g, and more preferably from 0.05 g to 10 g, based on 100 g of the silane monomer and/or the siloxane prepolymer.

In view of the storage stability, it is preferable that the by-products (for example, alcohols or water) and the catalyst are not contained in polysiloxane produced after hydrolysis and partial condensation. Therefore, it is preferable to purify polysiloxane. There is no specific limitation to the purification method. Preferably, polysiloxane is diluted with a hydrophobic solvent, and the organic layer washed with water several times is then concentrated with an evaporator to remove alcohols and water. Additionally, the catalyst can be removed using ion exchange resin.

The obtained polysiloxane suitable for the photo-curing polysiloxane composition of the present invention contains less than 30 wt % of a polysiloxane fraction having a molecular weight above 8,000, and 35 wt % to 60 wt % of a polysiloxane fraction having a molecular weight ranging from 500 to 2,000 when calculated from an integral molecular weight distribution curve obtained by plotting cumulative weight percentage versus molecular weight falling within a range between 500 and 50,000 measured by gel permeation chromatography.

Preferably, the polysiloxane fraction having a molecular weight above 8,000 is less than 25%. More preferably, the polysiloxane fraction having a molecular weight above 8,000 is less than 20%.

Preferably, the polysiloxane fraction having a molecular weight ranging from 500 to 2,000 is from 40% to 60%. More preferably, the polysiloxane fraction having a molecular weight ranging from 500 to 2,000 is from 45% to 60%.

When the polysiloxane fraction having a molecular weight above 8,000 is more than 30% or when the polysiloxane fraction having a molecular weight ranging from 500 to 2,000 is less than 35%, the developing property of a photo-curing polysiloxane composition containing polysiloxane may be deteriorated. When the polysiloxane fraction having a molecular weight ranging from 500 to 2,000 is more than 60%, the thickness uniformity of the film formed from the photo-curing polysiloxane composition reduces excessively.

Polysiloxane has a hydroxyl value ranging generally from 20 to 200 mg KOH/g, preferably from 25 to 180 mg KOH/g, and more preferably from 30 to 160 mg KOH/g.

When the hydroxyl value of a polysiloxane is from 20 to 200 mg KOH/g, the photo-curing polysiloxane composition containing polysiloxane has superior storage stability. That is, the developing property of the photo-curing polysiloxane composition is less likely to degrade over time.

O-naphthoquinonediazidesulfonate Compound:

There is no specific limitation to the o-naphthoquinonediazidesulfonate compound suitable in the photo-curing polysiloxane composition of the present invention. The o-naphthoquinonediazidesulfonate compound can be a fully or partially esterified compound. Preferably, the o-naphthoquinonediazidesulfonate compound is obtained via a reaction of o-naphthoquinonediazidesulfonic acid or salt thereof with a hydroxyl compound. More preferably, the o-naphthoquinonediazidesulfonate compound is obtained via a reaction of o-naphthoquinonediazidesulfonic acid or salt thereof with a polyhydroxyl compound.

Examples of o-naphthoquinonediazidesulfonic acid include, but are not limited to, o-naphthoquinonediazide-4-sulfonic acid, o-naphthoquinonediazide-5-sulfonic acid, o-naphthoquinonediazide-6-sulfonic acid, or the like. Examples of the salt of o-naphthoquinonediazidesulfonic acid include, but are not limited to, halide of o-naphthoquinonediazidesulfonic acid.

Examples of the hydroxyl compound include, but are not limited to:

(1) hydroxybenzophenone compounds, for example, but not limited to, 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, 2,3,4,3',4',5'-hexahydroxybenzophenone, or the like.

(2) hydroxyaryl compounds, for example, but not limited to, a hydroxyaryl compound represented by Formula (III):

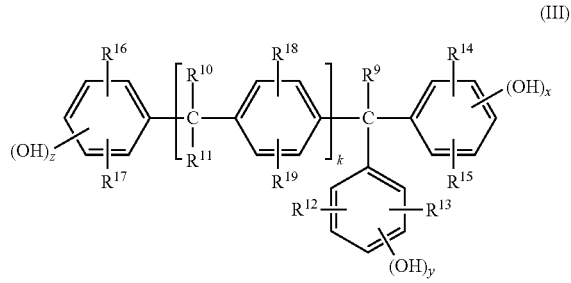

wherein $R^9$, $R^{10}$, and $R^{11}$ represent, respectively and independently, a hydrogen atom or a lower alkyl group;

$R^{12}$, $R^{13}$, $R^{14}$, $R^{15}$, $R^{16}$, and $R^{17}$ represent, respectively and independently, a hydrogen atom, a halogen atom, a lower alkyl group, a lower alkoxy group, a lower alkenyl group, or a cycloalkyl group;

$R^{18}$ and $R^{19}$ represent, respectively and independently, a hydrogen atom, a halogen atom, or a lower alkyl group;

x, y, and z denote, respectively and independently, an integer ranging from 1 to 3; and k denotes 0 or 1.

Examples of the hydroxyaryl compound represented by Formula (III) include, but are not limited to, tri(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl) isopropyl]-4-[1,1-bis(3-methyl-4-hydroxyphenyl)ethyl]benzene, or the like.

(3) (hydroxyphenyl)hydrocarbon compounds, for example, but not limited to, a (hydroxyphenyl)hydrocarbon compound represented by Formula (IV):

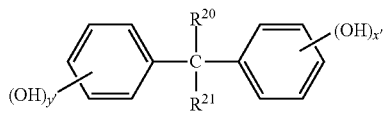

(IV)

wherein $R^{20}$ and $R^{21}$ represent, respectively and independently, a hydrogen atom or a lower alkyl group; and x' and y' denote, respectively and independently, an integer ranging from 1 to 3.

Examples of the (hydroxyphenyl)hydrocarbon compound represented by Formula (IV) include, but are not limited to, 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, bis(2,3,4-trihydroxyphenyl) methane, bis(2,4-dihydroxyphenyl)methane, or the like.

(4) other aromatic hydroxyl compounds, for example, but not limited to, phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially esterified or partially etherified gallic acid, or the like.

The preferred examples of the hydroxyl compounds include 2,3,4-trihydroxybenzophenone and 2,3,4,4'-tetrahydroxybenzophenone. The aforesaid hydroxyl compounds can be used alone or as a mixture of two or more.

The reaction of o-naphthoquinonediazidesulfonic acid or salt thereof with the hydroxyl compound is often conducted in an organic solvent such as dioxane, N-pyrrolidone, acetamide, or the like, in the presence of alkali such as triethanolamine, carbonic acid alkali, hydrogen carbonate alkali, or the like.

Preferably, the esterification rate of the o-naphthoquinonediazidesulfonate compound is more than 50%. That is, more than 50% by mole of the hydroxyl group contained in the hydroxyl compound undergoes an esterification reaction with o-naphthoquinonediazidesulfonic acid or salt thereof, based on 100% by mole of the total hydroxyl group contained in the hydroxyl compound. More preferably, the esterification rate of the o-naphthoquinonediazidesulfonate compound is more than 60%.

The o-naphthoquinonediazidesulfonate compound is used in an amount ranging preferably from 0.5 to 80 parts by weight, more preferably from 1 to 50 parts by weight, and most preferably from 2 to 30 parts by weight, based on 100 parts by weight of polysiloxane.

Solvent:

There is no specific limitation to the solvent suitable in the photo-curing polysiloxane composition of the present invention. Examples of the solvent preferably include an alcoholic hydroxyl-containing compound, a carbonyl-containing cyclic compound, or a combination thereof.

Examples of the alcoholic hydroxyl-containing compound include, but are not limited to, acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol, DAA), ethyl lactate, butyl lactate, propylene glycol monomethyl ether, propylene glycol monoethyl ether (PGEE), propylene glycol mono-n-propyl ether, propylene glycol mono-n-butyl ether, propylene glycol mono-t-butyl ether, 3-methoxy-1-butanol, 3-methyl-3-methoxy-1-butanol, or combinations thereof. Among them, diacetone alcohol, ethyl lactate, and propylene glycol monoethyl ether are preferable. The aforesaid alcoholic hydroxyl-containing compound can be used alone or as a mixture of two or more.

Examples of the carbonyl-containing cyclic compound include, but are not limited to, γ-butyrolactone, γ-valerolactone, δ-valerolactone, propylene carbonate, N-methylpyrrolidone, cyclohexanone, cycloheptanone, or combinations thereof. Among them, γ-butyrolactone, N-methylpyrrolidone, and cyclohexanone are preferable. The aforesaid carbonyl-containing cyclic compound can be used alone or as a mixture of two or more.

When the alcoholic hydroxyl-containing compound and the carbonyl-containing cyclic compound are used in combination, there is no specific limitation to the weight ratio thereof. Preferably, the weight ratio of the alcoholic hydroxyl-containing compound to the carbonyl-containing cyclic compound ranges from 99/1 to 50/50. More preferably, the weight ratio of the alcoholic hydroxyl-containing compound to the carbonyl-containing cyclic compound ranges from 95/5 to 60/40. It should be noted that, when the weight ratio of the alcoholic hydroxyl-containing compound to the carbonyl-containing cyclic compound ranges from 99/1 to 50/50, it is less likely for the unreactive silanol group in polysiloxane to undergo condensation reaction that may reduce the storage stability. Moreover, the miscibility between the polysiloxane and the o-naphthoquinonediazidesulfonate is good, so that it is less likely to opaque the protective film, thereby maintaining the transparency of the protective film.

Further solvents other than the aforesaid solvent can be included in the photo-curing polysiloxane composition of the present invention as long as the desirable effects obtainable by the photo-curing polysiloxane composition are not impaired. Examples of the further solvents include, but are not limited to: (1) esters, for example, ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate, or the like; (2) ketones, for example, methyl isobutyl ketone, diisopropyl ketone, diisobutyl ketone, or the like; (3) ethers, for example, diethyl ether, diisopropyl ether, di-n-butyl ether, diphenyl ether, or the like.

There is no specific limitation to the amount of the solvent used in the photo-curing polysiloxane composition. The solvent is used in an amount ranging generally from 50 to 1,200 parts by weight, preferably from 80 to 1,000 parts by weight, and more preferably from 100 to 800 parts by weight, based on 100 parts by weight of polysiloxane.

Additives:

Additives commonly used in the art can be optionally added to the photo-curing polysiloxane composition of the present invention, and include, but are not limited to, a sensitizer, a thermal acid generator, an adhesion auxiliary agent, a surfactant, a solubility promoter, a defoamer, or combinations thereof.

There is no specific limitation to the sensitizer. Preferably, the sensitizer is a phenolic hydroxyl-containing compound, for example, but not limited to: (1) trisphenol type compounds, for example, tri(4-hydroxyphenyl) methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-methylphenyl)-2-hydroxyphenylmethane, bis(4-hydroxy-2,5-dimethylphenyl)-4-hydroxyphenyl methane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis (5-cyclohexyl-4-hydroxy-2-methylphenyl)-2-hydroxyphenylmethane, bis (5-cyclohexyl-4-hydroxy-2-methylphenyl)-3,4-dihydroxyphenylmethane, or the like; (2) bisphenol type compounds, for example, bis(2,3,4-trihydroxyphenyl)methane, bis(2,4-dihydroxyphenyl)methane, 2,3,4-trihydroxyphenyl-4'-hydroxyphenyl methane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, 2-(2,3,4-trihydroxyphenyl)-2-(4'-hydroxy-3',5'-dimethylphenyl)propane, or the like; (3)polynuclear branched compounds, for example, 1-[1-(4-hydroxyphenyl)-isopropyl]-4-[1,1-bis(4-hydroxyphenyl)ethyl]benzene, 1-[1-(3-methyl-4-hydroxyphenyl]isopropyl]-4-[1,1-bis(3-methyl-4-hydroxyphenyl)ethyl]benzene, or the like; (4) condensation type phenol compounds, for example, 1,1-bis(4-hydroxyphenyl)cyclohexane, or the like; (5) polyhydroxy benzophenones, for example, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, or the like; or combinations thereof.

The sensitizer is used in an amount ranging preferably from 5 to 50 parts by weight, more preferably from 8 to 40 parts by weight, and most preferably from 10 to 35 parts by weight, based on 100 parts by weight of polysiloxane.

Examples of the thermal acid generator include, but are not limited to, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium, and methanesulfonates, trifluoromethanesulfonates, camphorsulfonates, p-toluenesulfonates, or the likes thereof, commercially available products manufactured by Sanshin Chemical Industry Co. Ltd. (for example, SI-60, SI-80, SI-100, SI-110, SI-145, SI-150, SI-60L, SI-80L, SI-100L, SI-110L, SI-145L, SI-150L, SI-160L, SI-180L), or combinations thereof. Among them, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium, and methanesulfonate, trifluoromethanesulfate, camphorsulfonate and p-toluenesulfonate thereof are preferred. The aforesaid thermal acid generator can be used alone or as a mixture of two or more.

The thermal acid generator is used in an amount ranging preferably from 0.01 to 10 parts by weight, more preferably from 0.03 to 8 parts by weight, and most preferably from 0.05 to 5 parts by weight, based on 100 parts by weight of polysiloxane.

The adhesion auxiliary agent is used to enhance the adhesion of the photo-curing polysiloxane composition of the present invention to a substrate containing a semiconductor material. Examples of the adhesion auxiliary agent include, but are not limited to, melamine compounds and silane compounds. Examples of the commercially available products of the melamine compounds include, but are not limited to, Cymel-300, Cymel-303, or the like manufactured by Mitsui Chemicals; and MW-30 MH, MW-30, MS-11, MS-001, MX-750, MX-706, or the like manufactured by Sanwa Chemical. Examples of the silane compounds include, but are not limited to, vinyltrimethoxysilane, vinyltriethoxysilane, 3-(meth))acryloxypropyltrimethoxysilane, vinyltri(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methylallyloxypropyltrimethoxysilane, 3-mercaptopropyltrimethoxysilane, commercially available products manufactured by Shin-Etsu Chemical Co., Ltd. (for example, KMB403), or the like.

The melamine compounds used as the adhesion auxiliary agent are in an amount ranging preferably from 0 to 20 parts by weight, more preferably from 0.5 to 18 parts by weight, and most preferably from 1.0 to 15 parts by weight, based on 100 parts by weight of polysiloxane.

The silane compounds used as the adhesion auxiliary agent are in an amount ranging preferably from 0 to 2 parts by weight, more preferably from 0.05 to 1 part by weight, and most preferably from 0.1 to 0.8 part by weight, based on 100 parts by weight of polysiloxane.

Examples of the surfactant include, but are not limited to, anionic surfactant, cationic surfactant, nonionic surfactant, amphoteric surfactant, polysiloxane surfactant, fluorinated surfactant, or combinations thereof. Examples of the surfactant include, but are not limited to: (1) polyoxyethylene alkyl ethers, for example, polyoxyethylene lauryl ether, or the like; (2) polyoxyethylene alkyl phenyl ethers, for example, polyoxyethylene octyl phenyl ether, polyoxyethylenenonyl phenyl ether, or the like; (3) polyethylene glycol diesters, for example, polyethylene glycol dilaurate, polyethylene glycol distearate, or the like; (4) sorbitan fatty acid esters; (5) fatty acid modified polyesters; and (6) tertiary amine modified polyurethanes. Examples of commercially available products of the surfactant include KP (manufacture by Shin-Etsu Chemical Co., Ltd.), SF-8427 (manufactured by Toray Dow Corning Silicone), Polyflow (manufactured by Kyoeisha Chemical Co., Ltd.), F-Top (manufactured by Tochem Product Co., Ltd.), Megaface (manufactured by DIC), Fluorade (manufactured by Sumitomo 3M), Surflon (manufactured by Asahi Glass), SINOPOL E8008 (manufactured by Sino-Japan Chemical Co., Ltd.), or combinations thereof.

The surfactant is used in an amount ranging preferably from 0.5 to 50 parts by weight, more preferably from 1 to 40 parts by weight, and most preferably from 3 to 30 parts by weight, based on 100 parts by weight of polysiloxane.

Examples of the defoamer include Surfynol MD-20, Surfynol MD-30, EnviroGem AD01, EnviroGem AE01, EnviroGem AE02, Surfynol DF 110D, Surfynol 104E, Surfynol 420, Surfynol DF 37, Surfynol DF 58, Surfynol DF 66, Surfynol DF 70, and Surfynol DF 210 (manufactured by Air products), or the like.

The defoamer is used in an amount ranging preferably from 1 to 10 parts by weight, more preferably from 2 to 9 parts by weight, and most preferably from 3 to 8 parts by weight, based on 100 parts by weight of polysiloxane.

Examples of the solubility promoter include, but are not limited to, N-hydroxydicarboxylic imide, or phenolic hydroxyl compounds, for example, the hydroxyl compounds used for manufacturing the o-naphthoquinonediazidesulfonate compound.

The solubility promoter is used in an amount ranging preferably from 1 to 20 parts by weight, more preferably from 2 to 15 parts by weight, and most preferably from 3 to 10 parts by weight, based on 100 parts by weight of polysiloxane.

The photo-curing polysiloxane composition of the present invention is manufactured by stirring the polysiloxane, the o-naphthoquinonediazidesulfonate compound, and the solvent optionally together with the additives, such as the sensitizer, the thermal acid generator, the adhesion auxiliary agent, the surfactant, the defoamer, and the solubility promoter in a stirrer.

The photo-curing polysiloxane composition is applied on a substrate by spin coating, slit coating, or the like, and is then prebaked to remove the solvent and to form a prebaked coating film. The conditions for the prebaking depend on the types and the formulating ratio of the components for the photo-curing polysiloxane composition. However, the prebaking is usually conducted at a temperature ranging from 70 to 110° C. for a period ranging from 1 to 15 minutes. The prebaked coating film is exposed via a photomask using ultraviolet light, such as g-line, h-line, i-line, or the like. The device for providing the ultraviolet light includes a (ultra-) high pressure mercury lamp, or a metal halide lamp. The prebaked coating film after exposing is immersed in a developer solution at a temperature of 23±2° C. for a period ranging from 15 seconds to 5 minutes so as to form a desired pattern. Examples of the developer include alkali compounds, such as sodiumhydroxide, potassiumhydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diazabicyclo-[5, 4,0]-7-undecene, or the like.

The concentration of the developer solution ranges preferably from 0.001 to 10 wt %, more preferably from 0.005 to 5 wt %, and most preferably, from 0.01 to 1 wt %.

The developer is removed by washing with water after the development. The coating film formed on the substrate is dried with compressed air or nitrogen, and is then post-baked using a heating device, such as a hot plate or an oven. The post-baking is conducted at a temperature ranging from 100 to 250° C. for a period ranging from 1 to 60 minutes if the hot plate is used or for a period ranging from 5 to 90 minutes if the oven is used. A protective film is formed on the substrate after the process aforementioned.

Examples of the substrate suitable for the present invention include alkali-free glass, soda-lime glass, Pyrex glass, quartz glass, a glass coated with a transparent conductive film thereon, and the like commonly used in a liquid crystal display; or a photoelectric conversion substrate (for example, a silicon substrate) used in a solid-state image sensor.

An element including the substrate and the protective film formed from the photo-curing polysiloxane composition of the present invention applied on the substrate can be used in a display device, a semiconductor device, an optical waveguide device, or the like.

The following examples are provided to illustrate the preferred embodiments of the invention, and should not be construed as limiting the scope of the invention.

EXAMPLES

Preparation of Polysiloxane

Preparation Example 1

A 500 ml three-necked flask was added with dimethyl dimethoxy silane (referred to as DMDMS, 84 g, 0.7 mole), phenyl trimethoxy silane (referred to as PTMS, 59.4 g, 0.3 mole), and propylene glycol monoethyl ether (referred to as PGEE, 180 g). Stirring was conducted at room temperature while an oxalic acid aqueous solution (0.20 g oxalic acid/30 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (A-1) via polycondensation. Methanol (73 g) and water (17 g) produced as by-products were separated by distillation.

Preparation Example 2

A 500 ml three-necked flask was added with DMDMS (84 g, 0.7 mole), PTMS (59.4 g, 0.3 mole), and PGEE (180 g). Stirring was conducted at room temperature while an oxalic acid aqueous solution (0.3 g oxalic acid/30 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 110° C. The mixture in the flask was stirred for a further 3 hours to obtain polysiloxane (A-2) via polycondensation. Methanol (73 g) and water (18 g) produced as by-products were separated by distillation.

Preparation Example 3

A 500 ml three-necked flask was added with DMDMS (72 g, 0.6 mole), phenyl triethoxy silane (referred to as PTES, 88.8 g, 0.37 mole), DMS-S27 (540 g, 0.03 mole), and PGEE (180 g). Stirring was conducted at room temperature while an oxalic acid aqueous solution (0.20 g oxalic acid/30 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (A-3) via polycondensation. Methanol (57 g), ethanol (48 g), and water (26 g) produced as by-products were separated by distillation.

Preparation Example 4

A 500 ml three-necked flask was added with PGEE (100 g). Stirring was conducted at room temperature while a solution of a silane monomer mixture and an oxalic acid aqueous solution were continuously added. The solution of the silane monomer mixture was prepared by dissolving DMDMS (84 g, 0.7 mole) and PTMS (59.4 g, 0.3 mole) in PGEE (80 g). The oxalic acid aqueous solution was prepared by dissolving oxalic acid (0.15 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (A-4) via polycondensation. Methanol (73 g) and water (16 g) produced as by-products were separated by distillation.

Preparation Example 5

A 500 ml three-necked flask was added with PGEE (100 g). Stirring was conducted at room temperature while a solution of a silane monomer mixture and an oxalic acid aqueous solution were continuously added. The solution of the silane monomer mixture was prepared by dissolving DMDMS (78 g, 0.65 mole) and PTMS (69.3 g, 0.35 mole) in PGEE (80 g). The oxalic acid aqueous solution was prepared by dissolving oxalic acid (0.2 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105 t. The mixture in the flask was stirred for a further 2 hours to obtain polysiloxane (A-5) via polycondensation. Methanol (75 g) and water (18 g) produced as by-products were separated by distillation.

Preparation Example 6

A 500 ml three-necked flask was added with PGEE (100 g). Stirring was conducted at room temperature while a solution of a silane monomer mixture and an oxalic acid aqueous solution were continuously added. The solution of the silane monomer mixture was prepared by dissolving methyltrimethoxysilane (referred to as MTMS, 81.6 g, 0.6 mole), PTMS (39.6 g, 0.2 mole), and PTES (48 g, 0.2 mole) in diacetone alcohol (referred to as DAA, 80 g). The oxalic acid aqueous solution was prepared by dissolving oxalic acid (0.12 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (A-6) via polycondensation. Methanol (76 g), ethanol (27 g), and water (25 g) produced as by-products were separated by distillation.

Preparation Example 7

A 500 ml three-necked flask was added with PGEE (100 g). Stirring was conducted at room temperature while a solution of a silane monomer mixture and an oxalic acid aqueous solution were continuously added. The solution of the silane monomer mixture was prepared by dissolving MTMS (81.6 g, 0.6 mole) and PTMS (79.2 g, 0.4 mole) in PGEE (80 g). The oxalic acid aqueous solution was prepared by dissolving oxalic acid (0.1 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (A-7) via polycondensation. Methanol (96 g) and water (24 g) produced as by-products were separated by distillation.

Preparation Example 8

A 500 ml three-necked flask was added with PGEE (100 g). Stirring was conducted at room temperature while a solution of a silane monomer mixture and an oxalic acid aqueous solution were continuously added. The solution of the silane monomer mixture was prepared by dissolving MTMS (81.6 g, 0.6 mole) and PTMS (79.2 g, 0.4 mole) in PGEE (80 g). The oxalic acid aqueous solution was prepared by dissolving oxalic acid (0.1 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 1.5 hours to obtain polysiloxane (A-8) via polycondensation. Methanol (96 g) and water (25 g) produced as by-products were separated by distillation.

The amounts of the silane monomers, the siloxane prepolymers, the solvents, and the catalysts, and the reaction conditions used in the preparation examples are summarized in Table 1.

TABLE 1

| | Silane monomers/Siloxane Prepolymers | | | | | Solvents | | | Catalysts (g) | Reaction | |
| Prep. Ex. | (moles) | | | | | (g) | | | Oxalic | Temp. | Polycondensation |
| | MTMS | DMDMS | PTMS | PTES | DMS-S27 | PGEE | DAA | Water | acid | (°C.) | Time (hrs) |
|---|---|---|---|---|---|---|---|---|---|---|---|
| A-1 | — | 0.70 | 0.30 | — | — | 180 | — | 30 | 0.20 | 105 | 2 |
| A-2 | — | 0.70 | 0.30 | — | — | 180 | — | 30 | 0.30 | 110 | 3 |
| A-3 | — | 0.60 | — | 0.37 | 0.03 | 180 | — | 30 | 0.20 | 105 | 2 |
| A-4 | — | 0.70 | 0.30 | — | — | 180 | — | 30 | 0.15 | 105 | 2 |
| A-5 | — | 0.65 | 0.35 | — | — | 180 | — | 30 | 0.20 | 105 | 2 |
| A-6 | 0.60 | — | 0.20 | 0.20 | — | 180 | 80 | 30 | 0.12 | 105 | 2 |
| A-7 | 0.60 | — | 0.40 | — | — | 180 | — | 30 | 0.10 | 105 | 2 |
| A-8 | 0.60 | — | 0.40 | — | — | 180 | — | 30 | 0.10 | 105 | 1.2 |

Preparation of Photo-Curing Polysiloxane Composition

Example 1

100 parts by weight of the polysiloxane (A-1) obtained in Preparation Example 1, 8 parts by weight of an o-naphthoquinonediazidesulfonate compound (DPAP200 manufactured by DKC, average esterification rate: 67%) obtained by reacting 1-[1-(4-hydroxyphenyl)isopropyl]-4-[1,1-bis(4-hydroxyphenyl)ethyl]benzene (referred to as TPPA) with o-naphthoquinonediazide-5-sulfonic acid were added into 100 parts by weight of PGEE. Stirring was conducted using a shaking type stirrer until a homogenous photo-curing polysiloxane composition was obtained. The obtained photo-curing polysiloxane composition was evaluated according to following evaluation methods. The evaluation results are shown in Table 2.

Examples 2 to 7 and Comparative Examples 1 to 4

Examples 2-7 and Comparative Examples 1 to 4 were conducted in a manner identical to that of Example 1 using the components and the amounts thereof shown in Table 2. The obtained photo-curing polysiloxane compositions of Examples 2 to 7 and Comparative Examples 1 to 4 were evaluated according to the following evaluation methods. The evaluation results are shown in Table 2.
Evaluation Methods:
1. Molecular Weight Distribution of Polysiloxane:
The molecular weight distribution of polysiloxane was determined by gel permeation chromatography (referred to as GPC) under the following conditions. As exemplified in FIG. 1, an integral molecular weight distribution curve was obtained by plotting cumulative weight percentage versus molecular weight falling within a range between 500 and 50,000. The weight percentages of a polysiloxane fraction having a molecular weight ranging from 500 to 2,000 and a polysiloxane fraction having a molecular weight above 8,000 were calculated from the integral molecular weight distribution curve.
Measurement Conditions for the GPC:
  Apparatus: 717 plus (manufactured by Waters)
  Columns: 79911GP-501, 79911GP-502, 79911GP-503, and 79911GP-504 (manufactured by Agilent Technologies)
  Detector: 2414 RI Detector (manufactured by Waters)
  Mobile Phase: tetrahydrofuran
  Flow Rate: 1.0 ml/min
  Injection Volume: 100 μl
  Measurement Temperature: 40° C.
  Measurement Period: 60 minutes
  Molecular Weight Standard: polystyrene
2. Hydroxyl Value of Polysiloxane:
1 g of polysiloxane was titrated with a potassium hydroxide solution (0.5 mole of potassium hydroxide/1 L of ethanol) up to the endpoint, and the weight of potassium hydroxide (x) in milligrams was then determined.
5 ml of an acetic anhydride solution (25 g of acetic anhydride/1 L of pyridine) was added to 1 g of polysiloxane, and heating was conducted for 1 hour so as to form acetic acid via a reaction of polysiloxane with acetic anhydride. Titration was then conducted with a potassium hydroxide solution (0.5 mole of potassium hydroxide/1 L of ethanol) up to the endpoint, and the weight of the used potassium hydroxide (y) in milligrams was then determined. The hydroxyl value of polysiloxane (in a unit of mg KOH/g) was calculated using the following formula:

Hydroxyl value(mg KOH/g)=$y-x$.

Figure 2:
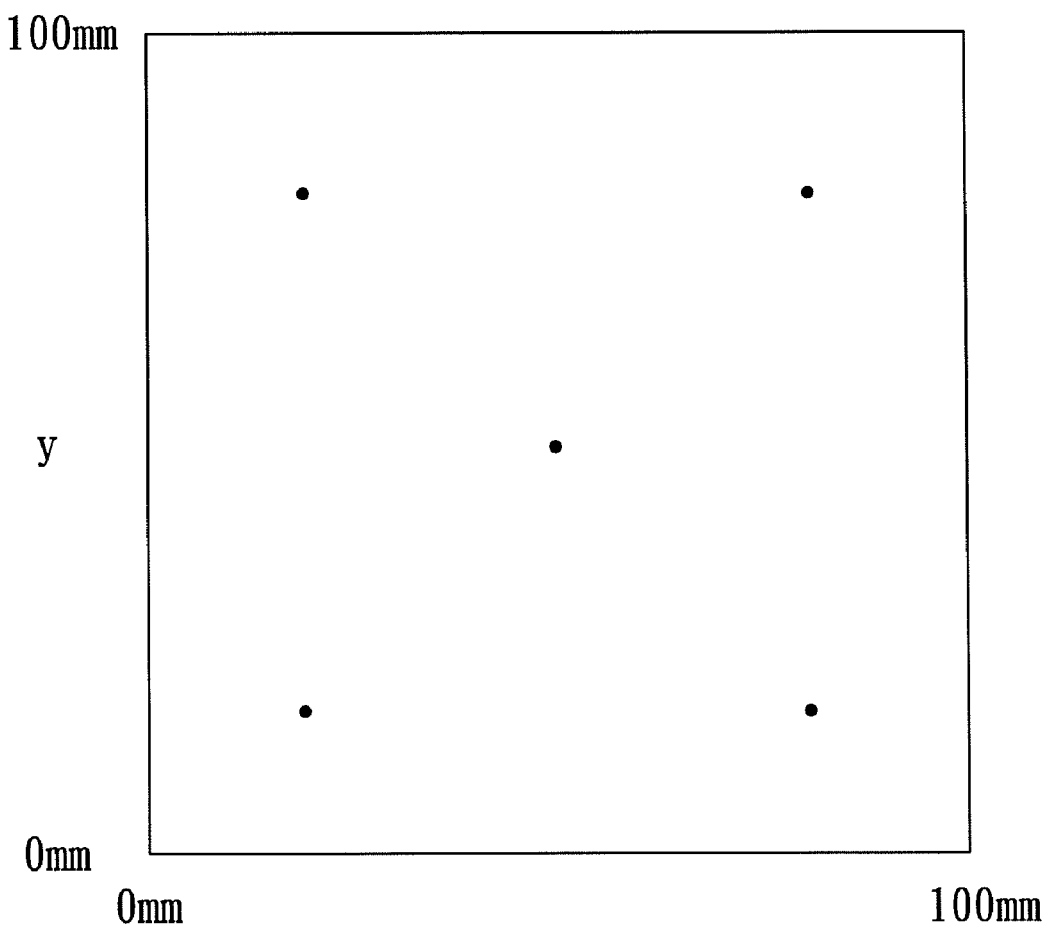
FIG. 2 is a schematic view illustrating the distribution of positions for measuring thickness of a film.

3. Film Thickness Uniformity:
The photo-curing polysiloxane composition was spin-coated on a glass substrate of 100 mm×100 mm, and was then pre-baked at a temperature of 110° C. for 2 minutes to form a pre-baked coating film on the substrate. The thickness of the pre-baked coating film was measured using a Tencor α-step probe profilometer. The distribution of measurement positions is shown in FIG. 2.
The film thickness uniformity was evaluated using the following formula:

Film Thickness Uniformity($U$)=($|T_{max}-T_{cen}|+|T_{min}-T_{cen}|$)×100% wherein
$T_{max}$: The maximum one of the film thicknesses measured at coordinates (20,20), (20,80), (80,20), and (80,80);
$T_{min}$: The minimum one of the film thicknesses measured at coordinates (20,20), (20,80), (80,20), and (80,80); and
$T_{cen}$: The film thickness measured at a coordinate (50,50).
○: $U<3\%$;
Δ: $3\% \leq U \leq 5\%$; and
X: $U>5\%$.
4. Developing Property:
The pre-baked coating film obtained from the evaluation of film thickness uniformity was treated with ultra-violet irradiation (90 mJ/cm$^2$) using an exposure machine (Model No. AG500-4N, manufactured by M & R Nano Technology) through a photo-mask, and was then immersed in a developer solution (a tetramethylammonium hydroxide solution, 2.38%) at 23° C. for 1 minute to dissolve the exposed portion of the pre-baked coating film. The pre-baked coating film after development was washed with water, and was then post-baked in an oven at 230° C. for 60 minutes to form a pattern on the glass substrate. The pattern was inspected using a microscope to determine whether or not residue is present around the exposed portion of the coating film.
◯: The residue was not present.
X: The residue was present.

TABLE 2

| Components | | Examples | | | | | | | Comparative Examples | | | |
|---|---|---|---|---|---|---|---|---|---|---|---|---|
| | | 1 | 2 | 3 | 4 | 5 | 6 | 7 | 1 | 2 | 3 | 4 |
| Polysiloxanes (pbw) | A-1 | — | — | — | — | 10 | — | — | 100 | — | — | — |
| | A-2 | — | — | — | — | — | — | 60 | — | 100 | — | — |
| | A-3 | — | — | — | — | — | 50 | — | — | — | 100 | — |
| | A-4 | 100 | — | — | — | — | — | — | — | — | — | — |
| | A-5 | — | 100 | — | — | — | 50 | — | — | — | — | — |
| | A-6 | — | — | 100 | — | — | — | 40 | — | — | — | — |
| | A-7 | — | — | — | 100 | — | — | — | — | — | — | — |
| | A-8 | — | — | — | — | 90 | — | — | — | — | — | 100 |
| o-naphthoquinonediazide sulfonate compounds (pbw) | B-1 | 8 | 8 | 8 | 8 | 3 | 8 | 6 | 8 | 8 | 8 | 8 |
| | B-2 | — | — | — | — | 3 | — | — | — | — | — | — |
| Solvents (pbw) | C-1 | 100 | 100 | 90 | 100 | 100 | 100 | 50 | 100 | 100 | 100 | 100 |
| | C-2 | — | — | 10 | — | — | — | 50 | — | — | — | — |
| Additives (pbw) | D-1 | — | 2 | — | — | — | 1 | — | — | — | — | — |
| | D-2 | — | — | — | 0.2 | — | 0.1 | — | — | — | — | — |
| Molecular weight distribution (wt %) | 500-2000 | 40 | 45 | 51 | 57 | 60 | 36 | 35 | 33 | 25 | 20 | 62 |
| | Above 8000 | 20 | 16 | 12 | 8 | 7 | 30 | 26 | 28 | 36 | 43 | 5 |
| Evaluation Items | Hydroxyl value | 38 | 46 | 55 | 67 | 71 | 22 | 28 | 26 | 15 | 12 | 69 |
| | Film thickness Uniformity | ◯ | ◯ | ◯ | ◯ | ◯ | ◯ | ◯ | ◯ | ◯ | ◯ | X |
| | development | ◯ | ◯ | ◯ | ◯ | ◯ | ◯ | ◯ | X | X | X | ◯ |

B-1: an o-naphthoquinonediazidesulfonate compound obtained by reacting TPPA with o-naphtaoquinonediazide-5-sulfonic acid (DPAP200 manufactured by DKC)
B-2: an o-naphthoquinonediazidesulfonate compound obtained by reacting 2,3,4,4'-tetrahydroxybenzophenone with o-naphthoquinonediazide-5-sulfonic acid
C-1: PGEE
C-2: DAA
D-1: MEGAFACE F-475 manufactured by DIC
D-2: KBM-403 manufactured by Shin-Etsu Chemical Co. Ltd.

As shown in Table 2, all of the polysiloxane contained in the photo-curing polysiloxane compositions of Examples 1 to 7 contain 36 wt % to 60 wt % of a polysiloxane fraction having a molecular weight ranging from 500 to 2,000, and 7 wt % to 30 wt % of a polysiloxane fraction having a molecular weight above 8,000, and the evaluated properties, such as the developing property and the film thickness uniformity, in Examples 1 to 7 are good. However, the polysiloxane contained in the photo-curing polysiloxane composition of Comparative Example 1 contains 33 wt % of a polysiloxane fraction having a molecular weight ranging from 500 to 2,000, and the polysiloxane contained in the photo-curing polysiloxane compositions of Comparative Examples 2 and 3 respectively contain 36 wt % and 43 wt % of a polysiloxane fraction having a molecular weight above 8,000. All of the Comparative Examples 1 to 3 have inferior developing property. Furthermore, the polysiloxane contained in the photo-curing polysiloxane composition of Comparative Example 4 contains 62 wt % of a polysiloxane fraction having a molecular weight ranging from 500 to 2,000, and the film thickness uniformity in Comparative Example 4 is inferior.

Therefore, it has been demonstrated that superior developing property and film thickness uniformity can be obtained by the photo-curing polysiloxane compositions of the present invention in which the molecular weight distribution of polysiloxane is specifically controlled.

In view of the aforesaid, the present invention provides a photo-curing polysiloxane composition having good developing property and film thickness uniformity, and a protective film made from the photo-curing polysiloxane composition via pre-baking, exposing, developing, and post-baking. The protective film can be used for protecting a substrate of a liquid crystal display, an organic electroluminescene display, and the like.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:
1. A photo-curing polysiloxane composition, comprising:
a polysiloxane;
an o-naphthoquinonediazidesulfonate compound; and
a solvent,
wherein said polysiloxane contains less than 30 wt % of a polysiloxane fraction having a molecular weight above 8,000, and 35 wt % to 60 wt % of a polysiloxane fraction having a molecular weight ranging from 500 to 2,000 when calculated from an integral molecular weight distribution curve obtained by plotting cumulative weight percentage versus molecular weight falling within a range between 500 and 50,000 measured by gel permeation chromatography.

2. The photo-curing polysiloxane composition as claimed in claim 1, wherein said polysiloxane has a hydroxyl value ranging from 20 to 200 mg KOH/g.

3. The photo-curing polysiloxane composition as claimed in claim 1, wherein said o-naphthoquinonediazidesulfonate compound is in an amount ranging from 0.5 to 80 parts by weight and said solvent is in an amount ranging from 50 to 1200 parts by weight based on 100 parts by weight of said polysiloxane.

4. The photo-curing polysiloxane composition as claimed in claim 1, wherein said o-naphthoquinonediazidesulfonate compound is obtained by reacting an o-naphthoquinonediazidesulfonic acid compound with a hydroxyl compound.

5. A protective film formed on a substrate, said protective film being formed by applying the photo-curing polysiloxane composition as claimed in claim 1 on the substrate.

6. An element, comprising a substrate, and the protective film as claimed in claim 5 applied on said substrate.

* * * * *